US012056574B2

(12) United States Patent
Harutyunyan

(10) Patent No.: US 12,056,574 B2
(45) Date of Patent: Aug. 6, 2024

(54) QUANTUM DEVICES AND PROCESSES OF USE

(71) Applicant: Honda Motor Co., Ltd., Tokyo (JP)

(72) Inventor: Avetik Harutyunyan, Santa Clara, CA (US)

(73) Assignee: Honda Motor Co., Ltd., Tokyo (JP)

( * ) Notice: Subject to any disclaimer, the term of this patent is extended or adjusted under 35 U.S.C. 154(b) by 239 days.

(21) Appl. No.: 17/501,091

(22) Filed: Oct. 14, 2021

(65) Prior Publication Data

US 2023/0116924 A1  Apr. 20, 2023

(51) Int. Cl.
*B32B 9/00*    (2006.01)
*B82Y 30/00*   (2011.01)
*C01B 32/159*  (2017.01)
*G06N 10/00*   (2022.01)

(52) U.S. Cl.
CPC .............. *G06N 10/00* (2019.01); *B82Y 30/00* (2013.01); *C01B 32/159* (2017.08); *Y10T 428/30* (2015.01)

(58) Field of Classification Search
CPC .... Y10T 428/30; G06N 10/00; C01B 32/159; B82Y 30/00
USPC ....................................................... 428/408
See application file for complete search history.

(56) References Cited

U.S. PATENT DOCUMENTS

| | | | | |
|---|---|---|---|---|
| 2003/0089899 | A1* | 5/2003 | Lieber | H01L 29/0665 257/E29.081 |
| 2013/0057333 | A1* | 3/2013 | Wu | B82Y 10/00 977/734 |
| 2014/0224329 | A1* | 8/2014 | Congreve | B82Y 10/00 136/263 |

OTHER PUBLICATIONS

Bao (CN 104841924) A Preparation Method Of Carbon Completely Encapsulates The Metal Nanometer Particle, 2017.*
Schulte et al., "Assembly of Cobalt Phthalocyanine Stacks inside Carbon Nanotubes", Adv. Mater. 2007, 19, 3312-3316.

\* cited by examiner

*Primary Examiner* — Daniel H Miller
(74) *Attorney, Agent, or Firm* — Patterson + Sheridan, LLP

(57) ABSTRACT

The present disclosure generally relates to compositions and devices for, e.g., hosting qubits, and processes of use. In an embodiment, a quantum device is provided. The quantum device includes a composition, the composition comprising a first component comprising a nanotube and a second component comprising a compound, the compound comprising a metal-bound cyclic tetrapyrrole, an ion thereof, or a combination thereof. In another embodiment, a process for controlling a quantum spin is provided. The process includes cooling a composition described herein to a temperature of about 1 K or more, applying a voltage to the composition, introducing a magnetic field to the composition, and introducing microwave radiation to the composition.

10 Claims, 3 Drawing Sheets

QUANTUM DEVICES AND PROCESSES OF USE

FIELD

The present disclosure generally relates to compositions and devices for, e.g., hosting qubits, and processes of use.

BACKGROUND

The qubit is quantum mechanical analogue of the classical bit and the building block of quantum devices such as quantum computers and sensors. Quantum devices utilize quantum mechanical phenomena such as entanglement and superposition to, e.g., manipulate data. Entanglement is the phenomenon where multiple quantum variables have related states irrespective of the distance between them in space or time, while superposition refers to the phenomenon in which a quantum variable can simultaneously exist in multiple different states. Technologies currently being utilized for creating qubits include superconducting qubits, semiconductor qubits, trapped ions qubits, photonic qubits, neutral atom qubits, and topological qubits.

Such technologies, however, have been unable to create a scalable, fully error-corrected quantum device or computer capable of carrying out tasks of practical interests. Various factors play a role in achieving such quantum devices and quantum computers. For example, in order to maintain atoms in a state of superposition and coherence, quantum devices and computers are typically cooled to about absolute zero and prevented from external perturbations. In addition, current systems are limited by two-qubit gate error rates and scaling is dictated by the degree of difficulty in obtaining low error rates with larger qubit systems. Thus, it is unclear whether the aforementioned technologies can scale to the level needed for large error-corrected quantum devices and computers.

Therefore, there is a need for new compositions and devices for, e.g., hosting qubits, and for processes of use.

SUMMARY

The present disclosure generally relates to compositions and devices for, e.g., hosting qubits, and processes of use.

In an aspect, a quantum device is provided. The quantum device includes a composition, the composition comprising: a first component comprising a nanotube; and a second component comprising a compound, the compound comprising a metal-bound cyclic tetrapyrrole, an ion thereof, or a combination thereof.

In another aspect, a device for reading a qubit, writing a qubit, or both, is provided. The device includes a gate electrode, a substrate disposed over at least a portion of the gate electrode, and a source electrode and a drain electrode disposed over the substrate. The device further includes a composition disposed above the substrate, at least a portion of the composition disposed between the source electrode and the drain electrode, the composition comprising: a first component comprising a nanotube; and a second component comprising a compound, the compound comprising a metal-bound cyclic tetrapyrrole, an ion thereof, or a combination thereof.

In another aspect, a process for controlling a quantum spin is provided. The process includes cooling a composition to a temperature of about 1 K or more, the composition comprising: a first component comprising a nanotube; and a second component comprising a compound, the compound comprising a metal-bound cyclic tetrapyrrole, an ion thereof, or a combination thereof. The process further includes applying a voltage to the composition, introducing a magnetic field to the composition, and introducing microwave radiation to the composition.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, for the disclosure may admit to other equally effective aspects.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Figure 1:
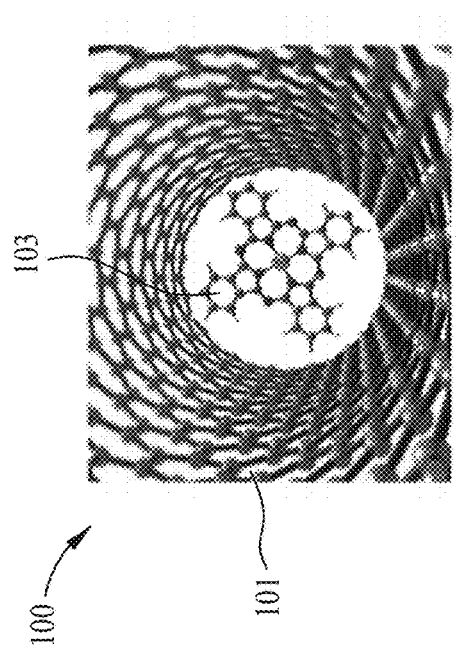
FIG. 1 is an illustration of an example composition for hosting qubits shown as an example molecular structure according to at least one aspect of the present disclosure.

The present disclosure generally relates to compositions and devices for, e.g., hosting qubits, and processes of use. Aspects described herein include quantum devices, such as molecular qubit devices, related computing devices, and processes for using the compositions and quantum devices. Briefly, and in some aspects, the compositions described herein include at least two components—a nanotube and a metal-bound organic compound disposed within the nanotube. The quantum devices described herein include these compositions.

Aspects described herein can enable formation of molecular quantum bits ("qubits") in qubit devices as well as the control of these and qubits to perform operations, e.g., quantum logic operations. The qubits can be used for, e.g., writing, storing, and reading information. In contrast to state-of-the-art approaches to qubit formation, aspects described herein can enable improved scalability in the number of qubits in the devices and strong spatial localization of the qubits. The strong spatial localization of the qubits enables, e.g., strong control over, e.g., qubit manipulation and interactions. Further, aspects described herein can be integrated into larger quantum devices such as quantum computing devices.

Generally, qubits house or host a single electron which stores quantum information. Spin qubits, for example, can be realized within a qubit, and these spin qubits can be, e.g., initialized, read out, and operated on. As described herein, the orientation of the qubit—e.g., spin-up and spin-down—can be controlled by utilizing a magnetic field. Utilization of a nanotube can further increase the coherence time of the qubits because it serves to isolate the spin(s) within it from the outside environment. In some examples, carbon nanotubes are utilized. Utilization of a carbon-based nanotube can enable, e.g., increased coherence time of the qubits because, e.g., $^{12}C$ is the more abundant of the two stable isotopes of carbon ($^{13}C$ being the other) and $^{12}C$ does not have a nuclear spin.

Use of a nanotube can also enable control over the number (concentration), distance, and location of the metal-bound organic compound(s) (e.g., metal-bound cyclic tetrapyrrole(s)) and thereby the qubit distribution. The location of the metal-bound organic compound(s) can be controlled because, e.g., it is known how to move nanotubes to desired locations. By being able to move the nanotube containing metal-bound organic compound(s), the spins can be close to the surface of the device. Having spins closer to the surface of the device enables improved quantum devices as the spin orientation can be better controlled by magnetic fields, optics, and/or electromagnetic radiation. The number and/or concentration of metal-bound organic compound(s) within an individual nanotube can be controlled by synthetic methods, allowing isolation of a single metal-bound organic compound or a plurality of metal-bound organic compound(s) within each nanotube.

As described herein, the inventor has found a new platform for hosting qubits based on, e.g., low-cost and chemically-modifiable organic semiconductors such as metal-bound organic compound(s). When the metal-bound organic compound is a metal-bound cyclic tetrapyrrole, the cyclic tetrapyrroles can act as, e.g., a multi-dentate ligand for a metal or metal ion. This metal-bound cyclic tetrapyrrole can then act to host local electronic spin qubits. Current methodologies utilizing metal phthalocyanines to host spin qubits suffer from very short coherence times on the order of microseconds. The inventor has solved this issue, and other issues, by using nanotubes to, e.g., isolate individual metal-bound cyclic tetrapyrroles or a plurality of metal-bound cyclic tetrapyrroles from environmental perturbations, thereby prolonging coherence time of the qubits, as well as enabling various spatial arrangement of individual metal-bound cyclic tetrapyrroles. For example, by aligning the nanotubes, changing the lengths of the nanotubes, and/or changing other characteristics/configurations of the nanotubes enables control over the spatial distribution of the metal-bound cyclic tetrapyrrole disposed within the nanotube. Moreover, the variation of the number of qubits that can be hosted by the compositions described herein, as well as the variation of the distances between the nanotubes hosting the qubits enables the introduction of entanglement between the qubits hosted by the metal-bound cyclic tetrapyrroles. This entanglement phenomenon can be exploited for quantum devices, quantum computing, and communications.

The terms molecular qubits and qubits may be used interchangeably herein unless the context indicates otherwise. For example, a molecular qubit device can refer to both a molecular qubit device and a qubit device.

Aspects of the present disclosure generally relate to compositions, such as compositions for hosting qubits. A non-limiting illustration of an example composition 100 is shown in FIG. 1, which shows the composition 100 as a molecular structure. Generally, the composition 100 includes a first component 101 and a second component 103. The second component 103 can be disposed within (e.g. disposed inside of, located within, contained within, encapsulated within, or otherwise embedded within) the first component 101. The composition can include a plurality of first components, a plurality of second components, or combinations thereof.

The first component 101 of the composition 100 can include a nanotube. An illustration of a nanotube 200 is shown in FIG. 2A. The nanotube 200 can be a carbon nanotube such as a single-walled carbon nanotube, a few-walled carbon nanotube, a multi-walled carbon nanotube, a double-wall carbon nanotube, or combinations thereof. These carbon nanotubes can be doped or non-doped. Single-walled carbon nanotubes can be synthesized according to known methods. Few-walled nanotubes, double-walled, and multi-walled nanotubes can be synthesized, characterized, co-deposited, and collected using any suitable method and apparatus known, including those used for single-walled nanotubes. The carbon nanotubes can range in length from about 50 nm to about 10 cm or greater, though longer or shorter carbon nanotubes are contemplated. Diameters of the carbon nanotubes can range from about 1 nm to about 10 nm, though nanotubes of longer or shorter diameters are contemplated. The nanotube can be partially cylindrical, substantially cylindrical, or cylindrical and/or partially hollow, substantially hollow, or hollow. Because, e.g., the nanotube is at least partially hollow, the second component 103 can be disposed within the nanotube.

Referring back to FIG. 1, the second component 103 of the composition 100 can be a metal-organic compound, (a metal-bound organic compound), an ion thereof, a reaction product of a metal and an organic compound, or combinations thereof. In some examples, the second component can be a metal-organic compound with non-zero spin. In some aspects, the second component 103 is a metal-bound cyclic tetrapyrrole, an ion thereof, a reaction product of a metal and a cyclic tetrapyrrole, or combinations thereof. In FIG. 1, the second component 103 is shown as a metal-bound cyclic tetrapyrrole. Cyclic tetrapyrroles are a class of chemical compounds that include four pyrrole or pyrrole-like rings. Examples of cyclic tetrapyrroles useful for the second component 103 include, but are not limited to, phthalocyanines ($C_{32}H_{18}N_8$), chlorins ($C_{20}H_{16}N_4$), porphyrins, bacteriochlorins ($C_{20}H_{16}N_4$), corroles ($C_{19}H_{14}N_4$), porphycenes ($C_{20}H_{14}N_4$), porphyrazines ($C_{16}H_{10}N_8$), derivatives thereof, or combinations thereof. The cyclic tetrapyrrole can be a tetradentate ligand that can bind a metal via at least one of its nitrogen atoms, such as at least two of its nitrogen atoms, at least three of its nitrogen atoms, or at least four of its nitrogen atoms. The cyclic tetrapyrrole can be planar or substantially planar, though non-planar and substantially non-planar cyclic tetrapyrroles are contemplated.

In some aspects, the cyclic tetrapyrrole can be unsubstituted or substituted. "Substituted cyclic tetrapyrrole" refers to a cyclic tetrapyrrole, where at least one hydrogen of the cyclic tetrapyrrole has been substituted with at least one heteroatom or heteroatom-containing group, such as one or more elements from Group 13-17 of the periodic table of the elements, such as halogen (F, Cl, Br, or I), O, N, Se, Te, P, As, Sb, S, B, Si, Ge, Sn, Pb, and the like, such as $C(O)R^*$, $C(C)NR^*_2$, $C(O)OR^*$, $NR^*_2$, $OR^*$, $SeR^*$, $TeR^*$, $PR^*_2$, $AsR^*_2$, $SbR^*_2$, $SR^*$, $SO_x$ (where x=2 or 3), $BR^*_2$, $SiR^*_3$, $GeR^*_3$, $SnR^*_3$, $PbR^*_3$, and the like or where at least one heteroatom has been inserted within the cyclic tetrapyrrole radical such as one or more of halogen (Cl, Br, I, F), O, N, S, Se, Te, $NR^*$, $PR^*$, $AsR^*$, $SbR^*$, $BR^*$, $SiR^*_2$, $GeR^*_2$, $SnR^*_2$, $PbR^*_2$, and the like, where R* is, independently, hydrogen, hydrocarbyl (e.g., $C_1$-$C_{10}$), or two or more R* may join together to form a substituted or unsubstituted completely saturated, partially unsaturated, fully unsaturated, or aromatic cyclic or polycyclic ring structure.

The metal of the second component 103 includes a 3d transition metal of the periodic table of the elements, a 4d transition metal of the periodic table of the elements, or a combination thereof. 3d transition metals belong to Period 3 of the periodic table of the elements and include Sc, Ti, Cr, Mn, Fe, Co, Ni, Cu, Zn, and combinations thereof 4d transition metals belong to Period 4 of the periodic table of the elements and include Y, Zr, Nb, Mo, Tc, Ru, Rh, Pd, Ag, Cd, and combinations thereof. In some aspects the metal is selected from the group consisting of Sc, Ti, Cr, Mn, Fe, Co, Ni, Cu, Zn, Y, Zr, Nb, Mo, Tc, Ru, Rh, Pd, Ag, Cd, and combinations thereof, such as Co, Cu, V, and combinations thereof.

Figure 2B:
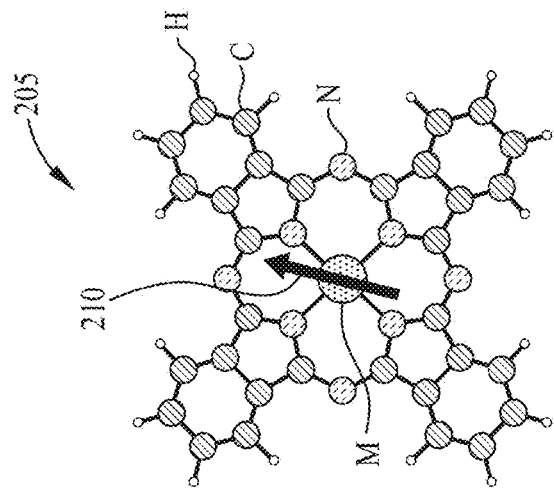
FIG. 2B is an illustration of an example metal-bound cyclic tetrapyrrole which can form a portion of the example composition of FIG. 1 according to at least one aspect of the present disclosure.
Figure 2A:
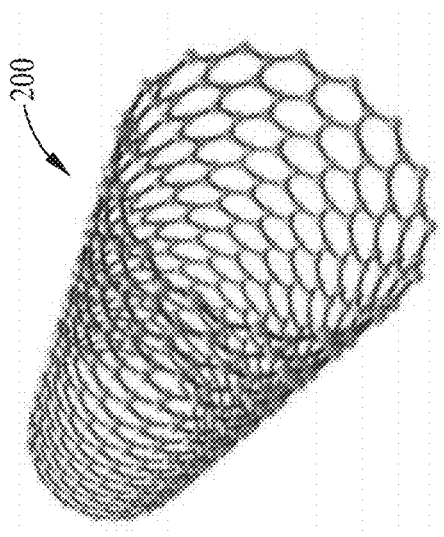
FIG. 2A is an illustration of an example nanotube which can form a portion of the example composition of FIG. 1 according to at least one aspect of the present disclosure.

In some aspects, the metal is bound to the cyclic tetrapyrrole as a metal-bound cyclic tetrapyrrole and/or a reaction product of the metal and cyclic tetrapyrrole, as shown in the non-limiting illustration of FIG. 2B. In this non-limiting example, the cyclic tetrapyrrole is a phthalocyanine (Pc) and shown as a metal-bound phthalocyanine 205 (MPc). The metal, hydrogen, carbon, and nitrogen of the MPc 205 are labeled M, H, C, N, respectively. When the metal is bound to the phthalocyanine, the phthalocyanine portion of the metal-bound phthalocyanine 205 can have the formula $C_{32}H_{16}N_8$. The metal-bound cyclic tetrapyrrole can be a coordination complex. The spin of the metal is indicated by the arrow 210 indicating that the metal has a spin state. The spin or spin state when describing transition metal complexes refers to the potential spin configurations of the metal's d electrons. The spin or spin state of the metal-bound cyclic tetrapyrrole can be manipulated by changing the metal and/or the cyclic tetrapyrrole. For example, when the metal-bound cyclic tetrapyrrole is a Cu(II)Pc, there exists a superhyperfine interaction between the copper and the 4 nitrogen atoms of the Pc ligand. Here, when the metal atom is Cu, a spin can occupy the highest orbital energy state, $dx^2-y^2$ ($B_{1g}$ state symmetry). As another example, when the metal-bound cyclic tetrapyrrole is a Co(II)Pc, there is no, or very little, superhyperfine interaction between the cobalt and the 4 nitrogen atoms of the Pc ligand. Here, when the metal atom is Co, the spin can occupy the $dz^2$ orbital ($B_{1g}$ state symmetry), which is relatively low in energy.

The coherence time of spin of the qubit can be altered based on, e.g., what orbital the unpaired spin is located in as the orbital in which the unpaired spin is located can be indicative of the probability of its overlapping with corresponding orbitals of neighboring nitrogen atoms. When the overlap is large, the interaction is strong with the nitrogen nuclear magnetic moment (e.g., a strong hyperfine interaction constant), and it will shorten the coherence time of the spin.

Figure 2C:
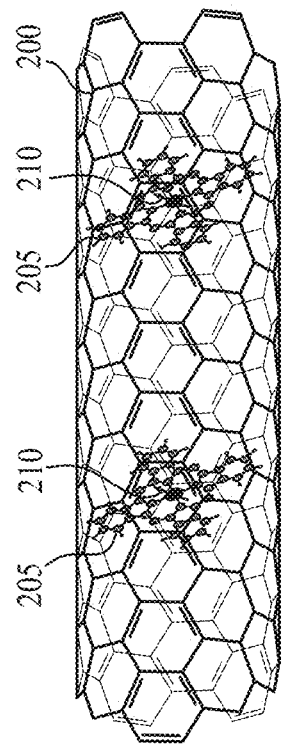
FIG. 2C is an illustration of an example composition having a single metal-bound cyclic tetrapyrrole disposed within a nanotube according to at least one aspect of the present disclosure.
Figure 2D:
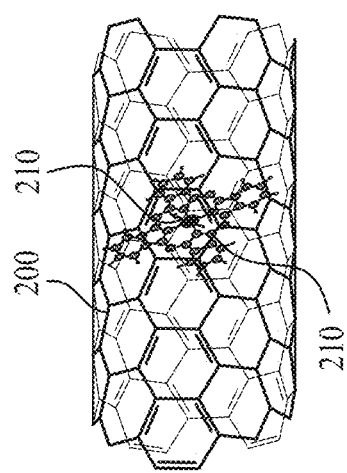
FIG. 2D is an illustration of an example composition having a plurality of metal-bound cyclic tetrapyrroles disposed within a nanotube according to at least one aspect of the present disclosure.

As described above, the composition can include one or more first components, one or more second components, or combinations thereof. FIGS. 2C and 2D show non-limiting illustration of example compositions with one or more of a second component 103 (e.g., MPc 205). Specifically, FIG. 2C shows a single MPc 205 disposed within a nanotube 200, and FIG. 2D shows two MPc 205 disposed within a nanotube 200. Any suitable number of MPc compounds can be disposed within the nanotube.

The composition 100 can be incorporated in a device such as quantum devices. Quantum devices are devices whose operation depends on quantum mechanical effects. Quantum devices described herein can be and/or function as, e.g., a quantum computer, a quantum information processing device (e.g., a quantum processor), a quantum magnetometer, a qubit device (or molecular qubit device), a read-write device, a quantum sensor, a spin resonance device (such as a spin resonance imaging device), or a component thereof. In some aspects, one or more devices described herein can be used to, e.g., read and/or write a qubit.

Figure 3:
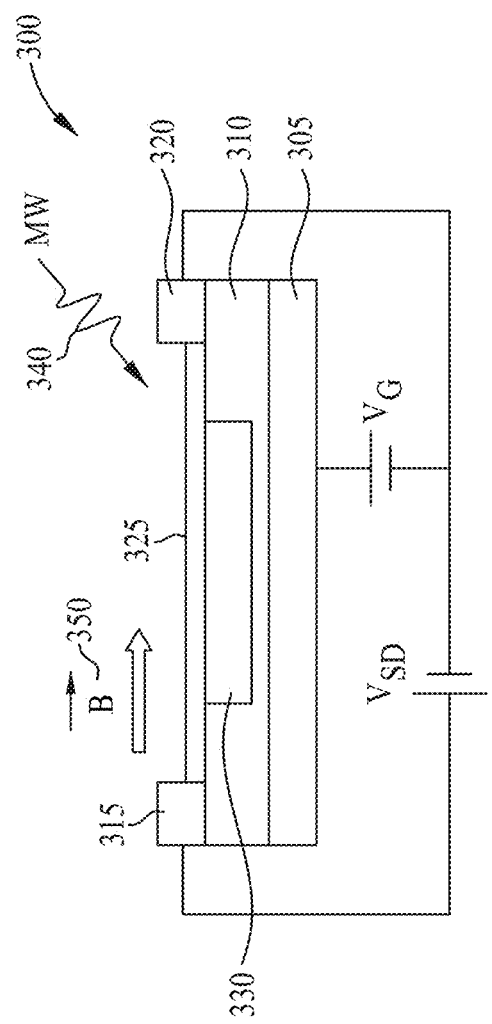
FIG. 3 shows an example quantum device incorporating a composition described herein according to at least one aspect of the present disclosure.

FIG. 3 shows an example quantum device 300 incorporating a composition described herein according to at least one aspect of the present disclosure. The quantum device 300 is an example of a qubit device. In some examples, the quantum device 300 can operate as, or otherwise include, a field effect transistor (FET) such as a back-gate field effect transistor (BG-FET). BG-FETs are types of transistors that utilize an electric field to control the flow of current through at least three terminals or electrodes—a gate, a source, and a drain. Although the device is shown as an Field-effect transistor (FET) device, other devices such as those described above are contemplated.

The quantum device 300 includes a gate electrode 305 and a substrate 310 positioned thereon. The substrate 310 is disposed on or over at least a portion of the gate electrode 305. The quantum device 300 can also include a source electrode 315 and a drain electrode 320 disposed over at least a portion of the substrate 310. A composition 325, such as those compositions described herein, such as a metal-bound organic compound, e.g., composition 100 described above, is disposed above the substrate 310. At least a portion of the composition 325 can be disposed between the source electrode 315 and the drain electrode 320. In some aspects, and as shown in FIG. 3, a gap or empty space 330 is positioned between at least a portion of the substrate 310 and the composition 325.

The source electrode 315, drain electrode 320, and the gate electrode 305 (e.g., a back-gate electrode) used for introducing a current through the composition 325. The gate electrode 305 can supply a potential or charge to the source electrode 315 (e.g., a gate-to-source voltage, VG). The VG applied can alter the conductivity between the drain electrode 320 and the source electrode 315. The drain electrode 320 can receive a current from the source electrode 315 based on the charge or potential supplied to the source electrode 315 by the gate electrode 305. In addition, a source-drain voltage ($V_{SD}$) can be applied to, e.g., create electrical current between the source electrode 315 and the drain electrode 320. Manipulation of the various voltages and currents enables movement of electrons through various components of the quantum device 300.

The source electrode 315 and/or the drain electrode 320 can be made from various suitable materials such as magnetic materials, such as Ni, copper, nickel, silver, aluminum, gold, platinum, palladium, bismuth, cobalt, iron, alloys thereof, or combinations thereof. High coercive-force materials can also be utilized for the source electrode 315 and/or the drain electrode 320. The gate electrode 305 can be made from various suitable materials such as silicon, doped silicon, graphene, carbon nanotube, or combinations thereof.

In operation, and as further described below, the FET device can be utilized to control the orientation of qubits hosted by the composition 325, e.g., a metal-bound cyclic tetrapyrrole disposed within the nanotube. The magnetic materials of the source electrode 315 and the drain electrode 320 can act as contacts to inject electrons into the compositions. Electromagnetic radiation (e.g., microwave radiation 340) can be introduced to the composition 325 in order to, e.g., change the direction of the spin of the qubits. In addition, an external magnetic field 350 can be applied to at least a portion of the device 300, e.g., at least a portion of the composition 325, in order to, e.g., increase the population of spins in a single direction. Because the orientation of the spin of the injected electrons and the spin of the qubit causes the resistance and/or detected current to vary, detection of the resistance and/or current can be utilized to measure whether the qubit spins are up or down. Electrons coming from the electrodes have a spin-up or spin-down orientation. The qubits associated with the metal-bound organic compound (e.g., the metal-bound cyclic tetrapyrrole) also have a spin-up or spin-down orientation. If the electrons and the qubits are both oriented in the same direction as they move toward the drain electrode, e.g., parallel, one resistance/current can be detected. If the electrons and qubits are oriented in different directions, e.g., anti-parallel, scattering is detected.

Accordingly, and in some aspects, devices described herein can optionally include a source for the electromagnetic radiation, a source for the magnetic field, and/or a detector. The source for the electromagnetic radiation can be a microwave generator that is configured to, e.g., scan a range of frequencies for manipulating quantum spins within the composition. The source for the magnetic field can be a magnetic field generator that is configured to, e.g., align the quantum spins in a preferential orientation. Additionally or alternatively, the magnetic field generator can be replaced with an electric field generator. The detector is configured to, e.g., detect the resistance and/or current traveling through the composition.

The quantum devices described herein can operate at a temperature of about absolute zero or higher such as about 1 K or higher, such as about 2 K or higher, such as about 3 K or higher such as about 4 K or higher, such as about 5 K or higher. In some aspects, the quantum device can be operated at a temperature from about absolute zero to about 80 K, such as from about 1 K to about 60 K, such as from about 2 K to about 40 K, such as from about 4 K to about 30 K, such as from about 2 K to about 20K.

The present disclosure is also generally related to processes for using the compositions and/or devices described herein. The processes can be utilized for controlling a spin, a charge, or both, of electron(s) and/or qubit(s). Such processes can be utilized to read and write information. In some aspects, the processes utilizes a composition described herein, e.g., composition 100 or composition 325. The composition can be incorporated within a device such as quantum device 300 or another suitable device.

Figure 4:
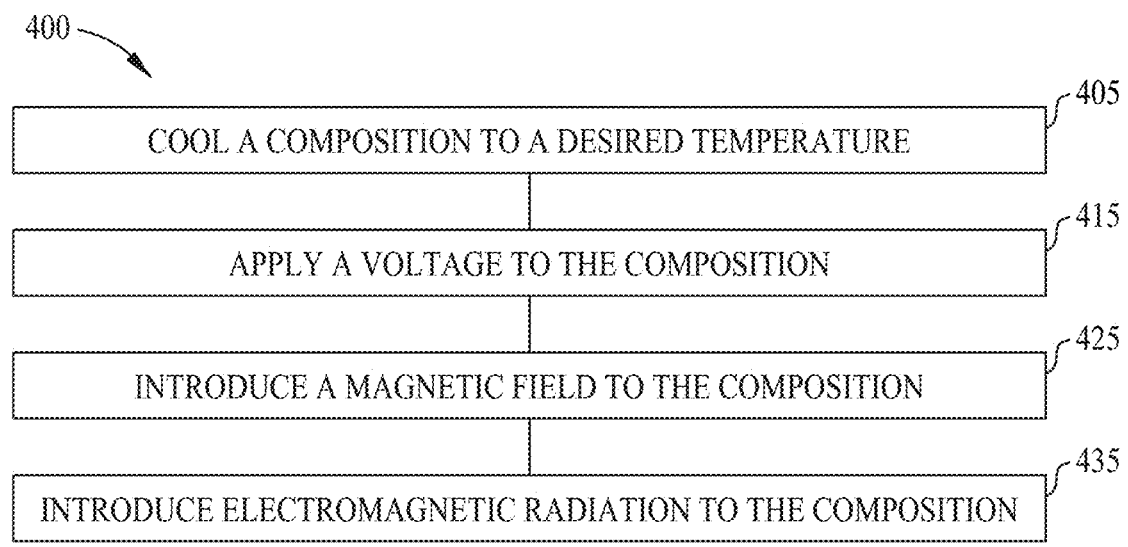
FIG. 4 is a flowchart showing selected operations of an example process for controlling a spin, a charge, or both, of electron(s) and/or qubit(s) according to at least one aspect of the present disclosure.

FIG. 4 is a flowchart showing selected operations of a process 400 for controlling a spin, a charge, or both, of electron(s) and/or qubit(s) according to at least one aspect of the present disclosure. Controlling a spin, a charge, or both of electron(s) and/or qubit(s), includes perturbing, changing, altering, adjusting, or otherwise influencing the spin, the charge, or both. The selected operations can be performed on compositions and/or devices described herein, such as the composition 100, a device incorporating composition 100, or components of a device incorporating composition 100.

The process 400 can begin by cooling at least a portion of a composition described herein (e.g., composition 100) or at least a portion of a device incorporating composition 100, such as device 300, to a temperature of about absolute zero or higher such as about 1 K or higher, such as about 2 K or higher, such as about 3 K or higher such as about 4 K or higher, such as about 5 K or higher. In some aspects, the operating temperature can be from about absolute zero to about 80 K, such as from about 1 K to about 60 K, such as from about 2 K to about 40 K, such as from about 4 K to about 30 K, such as from about 2 K to about 20K.

The process 400 can further include applying a voltage to at least a portion of the composition 100 at operation 415. As described above, compositions described herein (or a portion thereof) can be disposed between a source electrode and a drain electrode, e.g., the source electrode 315 and the drain electrode 320, as shown in FIG. 3. Accordingly, and in some aspects, operation 415 can take the form of applying a potential difference between a source and drain electrode, e.g., the source electrode 315 and the drain electrode 320. The application of a potential difference between the source electrode and the drain electrode enables movement of electrons through the composition. The potential difference between the source electrode and the drain electrode can be from about −5 V to about 5 V, such as from about −4 V to about 4 V, such as from about −3 V to about 3 V, such as from about −2 V to about 2 V, such as from about −1 V to about 1 V, such as from about −0.5 V to about 0.5 V, such as from about −0.4 V to about 0.4 V, such as from about −0.3 V to about 0.3 V, such as from about −0.2 V to about 0.2 V, such as from about −0.1 V to about 0.1 V. Higher or lower potential differences between the source electrode and the drain electrode are contemplated. Operation 415 can be performed before, during, and/or after operation 405. The process 400 is not limited by the device shown in FIG. 3. That is, a different device incorporating composition 100 can be utilized.

The process 400 can further include introducing a magnetic field to at least a portion of the composition 100, and/or to at least a portion of a device incorporating a composition described herein, e.g., device 300 incorporating composition 325. For example, the magnetic field can be introduced to the composition 100 or to a component of a device incorporating the composition 100 at operation 425. The magnetic field can come from an external source that generates an external magnetic field 350. Examples of such sources include electromagnets, fixed permanent magnets, and/or scanning electromagnets. Here, the composition 100 can be subjected to, e.g., a static magnetic field or a dynamic magnetic field. By applying a magnetic field to the composition 100, the spins of nuclei within the composition can be preferentially aligned with the applied magnetic field. The magnetic field can have a flux density of about 0.1 Tesla (T) to about 2 T, such as from about 0.2 T to about 1 T, such as from about 0.25 T to about 0.5 T, such as from about 0.3 T to about 0.4 T. The flux density of the magnetic field can depend on the metal of the composition 100. In at least one embodiment, the magnetic field can have a flux density of about Tesla (T) to about 14 T, such as from about 2 T to about 12 T, such as from about 4 T to about 10 T, such as from about 6 T to about 8 T. Higher or lower flux densities are contemplated. The magnetic field applied can be in the form of pulse(s) or be continuous.

The process 400 can further include introducing electromagnetic radiation, e.g., microwave radiation, to the composition 100 or to a component of a device incorporating the composition 100 at operation 435. The microwave radiation can have a frequency from about 300 MHz to about 170 GHz, such as from about 1 GHz to about 150 GHz, such as from about 2 GHz to about 100 GHz, such as from about 5 GHz to about 50 GHz, such as from about 9 GHz to about 35 GHz, such as from about 10 GHz to about 25 GHz. Higher or lower frequencies are contemplated. In some aspects, the microwave radiation can have a frequency from about 1 GHz or more and/or about 94 GHz or less, such as from about 9.3 GHz (X-band) to about 34 GHz (Q-band) or from about 110 GHz to about 170 GHz (D-band).

The source of the microwave radiation can be a microwave generator or microwave frequency generator positioned to irradiate the composition 100. The microwave generator or microwave frequency generator generates the microwave radiation 340. The microwave generator can be configured to scan a range of microwave frequencies for manipulating one or more of the plurality of quantum spins of the metal-bound tetracyclic pyrrole of the composition 100. The microwave radiation can be in the form of pulse(s) and/or continuous radiation. Each pulse can be performed for a time duration of less than about 1 second, such as about 10 milliseconds (ms) to about 950 ms, such as about 50 ms to about 900 ms, such as about 100 ms to about 800 ms, such as from about 200 ms to about 700 ms, such as from about 300 ms to about 700 ms, such as from about 400 ms to about 600 ms. Longer or shorter time periods are contemplated. Introduction of microwave radiation can be performed before, during, and/or after introduction of the magnetic field. Introduction of the magnetic field can be performed before, during, and/or after introduction of microwave radiation. Each introduction of magnetic field and/or microwave radiation can be performed a single time or multiple times. The magnetic field and the electromagnetic radiation applied to the composition control the orientation of the spins and electrons. Operation 435 can be performed before, during, and/or after operation 425.

The magnetic field applied to the composition at operation 425 and the microwave radiation applied to the composition at operation 435 can be varied together such that a change in magnetic field applied can also be accompanied by a change in the frequency of microwave radiation.

As a non-limiting example, for a $Cu^{2+}$-bound organic compound (e.g., a $Cu^{2+}$-bound cyclic tetrapyrrole) the frequency of the microwave radiation can be about 5 GHz to about 10 GHz, such as from about 8 GHz to about 10 GHz, such as from about 8.5 GHz to about 9.5 GHz, such as about 9 GHz; and/or the flux density of the magnetic field can be from about 0.25 T to about 0.4 T, such as from about 0.3 T to about 0.35 T.

In some aspects, the process 400 can further include applying a voltage to the composition via a gate electrode such as gate electrode 305. Such voltage can tune the energy level of the composition and/or components of the composition to allow or block electron(s) tunneling in from a source electrode and/or tunneling out from the composition or components of the composition to a drain electrode. The voltage applied to the gate electrode can be from about −80 V to about 80 V, such as from about −60 V to about 60 V, such as from about −40 V to about 40 V, such as from about −20 V to about 20 V. In at least one aspect, the voltage applied to the gate electrode is from about −80 V to about 0 V, such as from about −70 V to about −10 V, such as from about −60 V to about −20 V, such as from about −50 V to about −30 V. In another aspect, the voltage applied to the gate electrode is from about 0 V to about 80 V, such as from about 10 V to about 70 V, such as from about 20 V to about 60 V, such as from about 30 V to about 50 V. A source-drain bias can optionally be applied to the composition via, e.g., source and drain electrodes. The source-drain bias voltage can be about 50 mV or less, such as from about 10 mV to about 50 mV, such as from about 20 mV to about 40 mV. Higher or lower voltages are contemplated. Applying a voltage via a gate electrode can occur before, during, and/or after operations 405, 415, 425, and/or 435.

The process 400 can further include measuring and/or detecting a current, a resistance, and/or a magnetoresistance traveling through at least a portion of the composition. Measurement and/or detection of the current and/or resistance enables a user or controller to determine whether the spin(s) of the electron(s) and/or qubit(s) are up or down. Measurement and/or detection of the magnetoresistance can be obtained by dividing the source drain voltage (V) by current (I) for a given external magnetic field. The current (I) can be measured using the same or similar device as for the voltage. In at least one example, the resistance and/or magnetoresistance between the source electrode 315 and the drain electrode 320 can be measured to determine whether the spin(s) of the electron(s) and/or qubit(s) are up or down.

Each of the aforementioned operations of the process 400 can, individually, be applied to a device (or component thereof) housing the composition 100. The order of the operations can be in any suitable order such that one or more of operations 405, 415, 425, or 435 can be performed before, during, and/or after one or more of operations 405, 415, 425, or 435.

Figure 5:
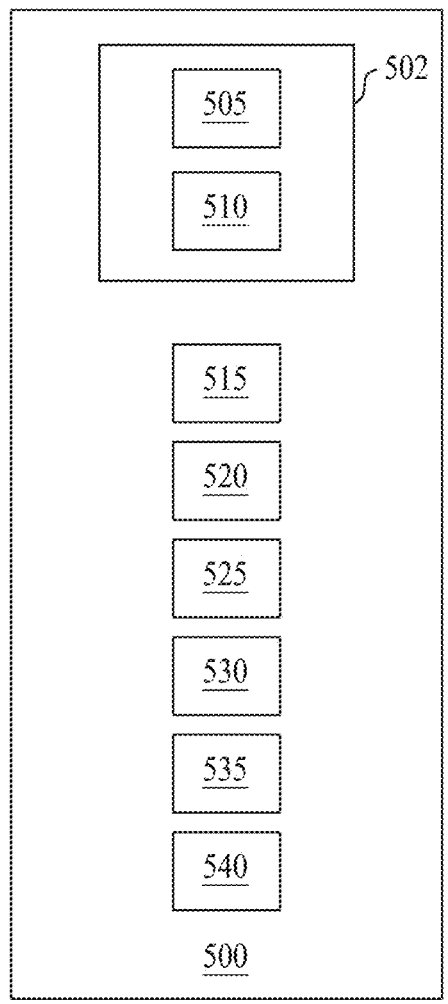
FIG. 5 is a block diagram of an example quantum computing device according to at least one aspect of the present disclosure.

FIG. 5 is a block diagram of an example quantum computing device 500 according to at least one aspect of the present disclosure. The quantum computing device 500 can incorporate composition 100 and/or quantum device 300. Any one or more of the components shown in FIG. 5 can be duplicated or omitted as desired. Moreover, additional components can be included as desired depending on the application.

The quantum computing device 500 can include one or more processors 502 (or one or more processing devices). Processors and processing devices refer to, e.g., a device or portion of a device that processes electronic data from memory and/or registers to transform that electronic data into other electronic data that can be stored in memory and/or registers. The one or more processors 502 can include a quantum processor 505 and an optional non-quantum processor (not shown). The quantum processor 505 can include one or more of quantum device 300 disclosed herein, and can perform data processing by performing operations on the qubits hosted by the quantum devices, as well as monitor the result of those operations. For example, different qubits can be allowed to interact, the quantum states of different qubits can be set or transformed, and the quantum states of qubits can be read (e.g., by another qubit). The quantum processor 505 can be a universal quantum processor, or specialized quantum processor configured to run one or more specific quantum algorithms. The quantum processor 505 can execute algorithms that are suitable for quantum computers. The quantum processor 505 can also include support circuitry 510 to support the processing capability of the quantum processor 505, such as multiplexers, signal mixers, input/output channels, analog-to-digital converters, and quantum. For example, the quantum processor 505 can include circuitry to provide current to the quantum device 300. The optional non-quantum processor (not shown) can provide peripheral logic to support an operation of the quantum processor 505. As examples, the optional non-quantum processor can control performance of a write and/or read operation, perform computing functions to support and/or supplement the computing functions provided by the quantum processor 505. The optional non-quantum processor can interface with one or more of the other components of the quantum computing device 500 such as the display device 530 discussed below. The optional non-quantum processor can include a central processing unit (CPU), a graphic processing unit, a digital signal processors, an application-specific integrated circuit (ASIC), a server processor, and/or other suitable processors.

The quantum computing device 500 can further include a communication chip 515. The communication chip 515 can be configured to manage wireless or non-wireless communications for the communication of data. The communication chip 515 can implement any number of wireless protocols or standards such as Institute for Electrical and Electronic Engineers (IEEE) standards including Wi-Fi (IEEE 802.11 family), IEEE 802.16 standards, and/or Long-Term Evolution (LTE) project along with any amendments, updates, and/or revisions. The communication chip 515 can operate in accordance with a Universal Mobile Telecommunications System (UMTS), General Packet Radio Service (GPRS), High Speed Packet Access (HSPA), Evolved HSPA (E-HSPA), Global System for Mobile Communication (GSM), and/or LTE network. The communication chip 515 can operate in accordance with Enhanced Data for GSM Evolution (EDGE), GSM EDGE Radio Access Network (GERAN), Universal Terrestrial Radio Access Network (UTRAN), Evolved UTRAN (E-UTRAN), Time Division Multiple Access (TDMA), Code Division Multiple Access (CDMA), Evolution-Data Optimized (EVDO), Digital Enhanced Cordless Telecommunications (DECT), derivatives thereof, combinations thereof, as well as any other wireless protocols that are designated as 3G, 4G, 5G, and so forth. In some aspects, the communication chip 515 can manage wired communications, such as electrical, optical, or any other suitable communication protocols (e.g., the Ethernet). The communication chip 515 can include multiple communication chips each of which can be, independently wired, or non-wired. In at least one aspect, a first communication chip 515 can be dedicated to wireless communications and a second communication chip 515 can be dedicated to wired communications. In some aspects, a first communication chip 515 can be dedicated to shorter-range wireless communications such as Wi-Fi or Bluetooth, and a second communication chip 515 can be dedicated to longer-range wireless communications such as GPRS, CDMA, WiMAX, GPS, EDGE, LTE, EVDO, or others.

The quantum computing device 500 can further include a memory 520. The memory 520 can be volatile memory such as dynamic random access memory (DRAM), nonvolatile memory such as read-only memory (ROM), a hard drive, solid state memory, and/or flash memory. The state(s) of qubits in the quantum processor 505 can be read and stored in the memory 520. This memory 520 can be utilized as cache memory and can include embedded spin transfer torque magnetic random-access memory (STT-MRAM) and/or dynamic random access memory (eDRAM). The memory 520 can include memory that shares a die with the optional non-quantum processor. The quantum computing device 500 can include battery/power circuitry 525. The battery/power circuitry 525 can include one or more energy storage devices (e.g., batteries or capacitors) and/or circuitry for coupling components of the quantum computing device 500 to an energy source separate from or external to the quantum computing device 500 (e.g., an AC line power). The quantum computing device 500 can include a display device 530 (or corresponding interface circuitry), and/or an audio input/output device 535 (or corresponding interface circuitry).

The display device 530, when included in the quantum computing device 500, can include a visual indicator, such as a touchscreen display, a heads-up display, a flat panel display, a computer monitor, a projector, a liquid crystal display (LCD), and/or a light-emitting diode display. Other visual indicators are contemplated. The audio input/output device 535 can include a device that generates an audible indicator such as a speaker, a headset, earbuds, etc., and/or a device that generates a signal representative of a sound, such as a microphone, a microphone array, or a digital instruments (e.g., instruments having a musical instrument digital interface (MIDI) output). Other optional output devices (or corresponding interface circuitry) and other optional input devices (or corresponding interface circuitry) can be included in the quantum computing device 500. Non-limiting, but illustrative, examples of such optional input devices can include an image capture device, a keyboard, a cursor control device such as a mouse, a stylus, a touchpad, a bar code reader, a Quick Response (QR) code reader, a sensor, a radio frequency identification (RFID) reader, a compass, a gyroscope, and/or an accelerometers. Non-limiting, but illustrative, examples of such optional output devices can include a wired or wireless transmitter for providing information to other device(s), a printer, an audio codec, a video codec, and/or an additional storage device. An antenna 540 can also be included in the quantum computing device 500. The antenna 540 can serve to facilitate wireless communications and/or to receive other wireless communications, e.g., FM and/or AM radio transmissions.

A number of components are shown in FIG. 5 as included in the quantum computing device 500, but one or more of these components can be omitted or duplicated, as suitable for the application. In some aspects, some or all of the components included in the quantum computing device 500 can be attached to one or more printed circuit boards, e.g., a motherboard). In some aspects, various ones of these components can be fabricated onto a single system-on-a-chip (SoC) die. Additionally, in various aspects, the quantum computing device 500 may be free of one or more of the components shown in the illustration of FIG. 5, but the quantum computing device 500 can include interface circuitry for coupling to the one or more components. For example, the quantum computing device 500 may be free of an audio input/output device 535, and instead include audio input/output device interface circuitry, e.g., connectors and supporting circuitry to which an audio input/output device 535 can be coupled.

The following examples are put forth so as to provide those of ordinary skill in the art with a complete disclosure and description of how to make and use aspects of the present disclosure, and are not intended to limit the scope of aspects of the present disclosure. Efforts have been made to ensure accuracy with respect to numbers used (e.g. amounts, dimensions, etc.) but some experimental errors and deviations should be accounted for.

EXAMPLES

The synthesis of metal-bound cyclic tetrapyrrole disposed within a carbon nanotube can be performed according to the following non-limiting procedure. Multi-walled carbon nanotubes, having an average number of layers between 3 and 6, and an average inner diameter of $(24\pm3)$Å, and cobalt phthalocyanine (CoPc, Sigma-Aldrich) were utilized for this example.

Purified carbon nanotubes were oxidized in air at about 400° C. for about 40 minutes, resulting in a weight loss of around 40%. This thermal treatment opens the nanotube caps and also partly removes amorphous carbon from the surface of the tubes. They were then mixed with an excess of sublimation purified CoPc in a quartz tube, sealed in a vacuum of about $10^{-6}$ Torr and heated at about 375° C. for about three days. CoPc that had settled on the outside of the nanotubes was removed by repeated rinsing with a mixture of chloroform and 1% trifluoroacetic acid. A small portion of the filled nanotubes was then dispersed onto a transmission electron microscopy (TEM) grid. Dried nanotubes were resuspended in methanol and sonicated for about 30 min. If desired, the nanotubes can then be drop-deposited onto Si/SiO2 substrates.

The present disclosure generally relates to compositions and devices for, e.g., hosting qubits, and processes of use. Aspects described herein include quantum devices, such as molecular qubit devices, related computing devices, and processes for using the compositions and quantum devices. Aspects described herein can enable formation of qubits in quantum devices as well as the control of these qubits to perform operations, e.g., quantum logic operations.

Aspects Listing

The present disclosure provides, among others, the following aspects, each of which can be considered as optionally including any alternate aspects:

Clause 1. A quantum device, comprising:
a composition, the composition comprising:
a first component comprising a nanotube; and
a second component comprising a compound, the compound comprising a metal-bound cyclic tetrapyrrole, an ion thereof, or a combination thereof.

Clause 2. The quantum device of Clause 1, wherein the second component is disposed within the first component.

Clause 3. The quantum device of Clause 1 or Clause 2, wherein the nanotube is a single wall carbon nanotube, a multi-wall carbon nanotube, a few-wall carbon nanotube, a double-wall carbon nanotube, or combinations thereof.

Clause 4. The quantum device of any one of Clauses 1-3, wherein the cyclic tetrapyrrole comprises phthalocyanine, chlorin, porphyrin, bacteriochlorin, corrole, porphycene, porphyrazine, or combinations thereof.

Clause 5. The quantum device of any one of Clauses 1-4, wherein the metal comprises a 3d transition metal of the periodic table of the elements, a 4d transition metal of the periodic table of the elements, or a combination thereof.

Clause 6. The quantum device of Clause 5, wherein the metal comprises Cu, Co, V, or combinations thereof.

Clause 7. The quantum device of any one of Clauses 1-6, wherein the quantum device is a quantum computer, a quantum information processing device, a quantum magnetometer, a qubit device, a read-write device, a quantum sensor, a quantum spin resonance device, or a component thereof.

Clause 8. The quantum device of any one of Clauses 1-7, wherein the quantum device is configured to operate at a temperature of 4 K or higher.

Clause 9. A device for reading and writing a qubit, comprising:
a gate electrode;
a substrate disposed over at least a portion of the gate electrode;
a source electrode and a drain electrode disposed over the substrate;
a composition disposed above the substrate, at least a portion of the composition disposed between the source electrode and the drain electrode, the composition comprising:
a first component comprising a nanotube; and
a second component comprising a compound, the compound comprising a metal-bound cyclic tetrapyrrole, an ion thereof, or a combination thereof.

Clause 10. The device of Clause 9, wherein the source electrode and the drain electrode are made of a magnetic material.

Clause 11. The device of Clause 9 or Clause 10, wherein:
the metal comprises a 3d transition metal of the periodic table of the elements, a 4d transition metal of the periodic table of the elements, or a combination thereof,
the cyclic tetrapyrrole comprises phthalocyanine, chlorin, porphyrin, bacteriochlorin, corrole, porphycene, porphyrazine, or combinations thereof, or
a combination thereof.

Clause 12. The device of Clause 11, wherein the cyclic tetrapyrrole comprises phthalocyanine.

Clause 13. The device of Clause 11 or Clause 12, wherein the metal comprises Cu, Co, V, or combinations thereof.

Clause 14. The device of any one of Clauses 11-13, wherein the second component is disposed within the first component.

Clause 15. The device of any one of Clauses 11-14, wherein the nanotube is a single-wall carbon nanotube, a multi-wall carbon nanotube, a double-wall carbon nanotube, a few-wall carbon nanotube, or combinations thereof.

Clause 16. A process for controlling a quantum spin, comprising:
cooling a composition to a temperature of about 1 K or more, the composition comprising:
a first component comprising a nanotube; and
a second component comprising a compound, the compound comprising a metal-bound cyclic tetrapyrrole, an ion thereof, or a combination thereof;
applying a voltage to the composition;
introducing a magnetic field to the composition; and
introducing microwave radiation to the composition.

Clause 17. The process of Clause 16, further comprising detecting a resistance, a magnetoresistance, a current, or combinations thereof, the resistance, the magnetoresistance, the current, or combinations thereof being related to an orientation of the quantum spin.

Clause 18. The process of Clause 16 or Clause 17, wherein the process is configured to control reading and writing of a qubit.

Clause 19. The process of any one of Clauses 16-18, wherein at least a portion of the process is performed at a temperature greater than 1 K.

Clause 20. The process of any one of Clauses 16-19, wherein:
the metal comprises a 3d transition metal of the periodic table of the elements, a 4d transition metal of the periodic table of the elements, or a combination thereof,
the cyclic tetrapyrrole comprises phthalocyanine, chlorin, bacteriochlorin, porphyrin, corrole, porphycene, porphyrazine, or combinations thereof, or
a combination thereof.

As is apparent from the foregoing general description and the specific aspects, while forms of the aspects have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "Is" preceding the recitation of the composition, element, or elements and vice versa, e.g., the terms "comprising," "consisting essentially of," "consisting of" also include the product of the combinations of elements listed after the term.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise. For example, aspects comprising "a nanotube" include aspects comprising one, two, or more nanotubes, unless specified to the contrary or the context clearly indicates only one nanotube is included.

While the foregoing is directed to aspects of the present disclosure, other and further aspects of the disclosure may be devised without departing from the basic scope thereof, and the scope thereof is determined by the claims that follow.

What is claimed is:

1. A device for reading a qubit, writing a qubit, or both, comprising:
   a gate electrode;
   a substrate disposed over at least a portion of the gate electrode;
   a source electrode and a drain electrode disposed over the substrate;
   a composition disposed above the substrate, at least a portion of the composition disposed between the source electrode and the drain electrode, the composition comprising:
      nanotubes having an average number of layers that is between 3 and 6 and an average inner diameter of 24±3 Å; and
      a metal-bound cyclic tetrapyrrole, an ion thereof, or a combination thereof encapsulated within each of the nanotubes, the metal of the metal-bound cyclic tetrapyrrole comprising Cu or V, the cyclic tetrapyrrole of the metal-bound cyclic tetrapyrrole comprising phthalocyanine, chlorin, porphyrin, bacteriochlorin, corrole, porphycene, porphyrazine, or combinations thereof.

2. The device of claim 1, wherein the source electrode and the drain electrode are made of a magnetic material.

3. The device of claim 1, wherein the cyclic tetrapyrrole comprises phthalocyanine.

4. The device of claim 1, wherein the nanotubes are single-wall carbon nanotubes, a multi-wall carbon nanotubes, a double-wall carbon nanotubes, a few-wall carbon nanotubes, or combinations thereof.

5. A process for controlling a quantum spin, comprising:
   cooling a composition to a temperature of about 1 K or more, the composition comprising:
      multi-wall carbon nanotubes, the multi-wall carbon nanotubes having an average number of layers that is between 3 and 6, the multi-wall carbon nanotubes having an average inner diameter of 24±3 Å; and
      a metal-bound cyclic tetrapyrrole, an ion thereof, or a combination thereof encapsulated within each of the multi-wall carbon nanotubes, the metal of the metal-bound cyclic tetrapyrrole comprising Cu or V;
   applying a voltage to the composition;
   introducing a magnetic field to the composition; and
   introducing microwave radiation to the composition.

6. The process of claim 5, further comprising detecting a resistance, a magnetoresistance, a current, or combinations thereof, the resistance, the magnetoresistance, the current, or combinations thereof being related to an orientation of the quantum spin.

7. The process of claim 5, wherein the process is configured to control reading and writing of a qubit.

8. The process of claim 5, wherein at least a portion of the process is performed at a temperature of 4 K or higher.

9. The process of claim 5, wherein the cyclic tetrapyrrole of the metal-bound cyclic tetrapyrrole comprises phthalocyanine, chlorin, bacteriochlorin, porphyrin, corrole, porphycene, porphyrazine, or combinations thereof.

10. The process of claim 5, wherein the cyclic tetrapyrrole of the metal-bound cyclic tetrapyrrole comprises phthalocyanine.

* * * * *